US006297640B1

(12) United States Patent
Hayes

(10) Patent No.: US 6,297,640 B1
(45) Date of Patent: Oct. 2, 2001

(54) TRANSFER SWITCH POSITION SENSING USING COIL CONTROL CONTACTS

(75) Inventor: John Hayes, Blairstown, NJ (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 0 days.

(21) Appl. No.: 09/289,916

(22) Filed: Apr. 12, 1999

(51) Int. Cl.[7] ..................... G01R 31/02
(52) U.S. Cl. ..................... 324/415
(58) Field of Search ..................... 324/418, 426, 324/427, 79, 415; 307/64, 126, 127, 141, 66, 87, 113; 361/44, 45; 335/161

(56) References Cited

U.S. PATENT DOCUMENTS 5,736,594 * 4/1998 Sheppard et al. ..................... 307/64

* cited by examiner

*Primary Examiner*—Safet Metjahic
*Assistant Examiner*—E P LeRoux
(74) *Attorney, Agent, or Firm*—Levine & Mandelbaum

(57) ABSTRACT

A method and apparatus for determining the position of the main contacts of an automatic transfer switch, without need for special position contacts, by monitoring for the presence of voltages at the normal source voltage contacts, the alternate source voltage contacts, the normal source coil control voltage contacts and the alternate source coil control voltage contacts of the automatic transfer switch, and providing an indication of switch position in response thereto.

26 Claims, 7 Drawing Sheets

TRANSFER SWITCH POSITION SENSING USING COIL CONTROL CONTACTS

BACKGROUND OF THE INVENTION

This invention relates to an apparatus and method for determining the state of an automatic transfer switch. More specifically, the invention is directed to a method of, and the construction of apparatus for, determining the position or state of an automatic transfer switch from voltages readily available without need for special switch position contacts.

An electronic control circuit for an automatic transfer switches must monitor the position of the transfer switch in order to initiate proper action in response to a power outage or restoration. It is known in the art to provide an automatic transfer switch with auxiliary position contacts for determining the state or position of the switch. The control circuit is operatively connected to the position contacts for determining whether the contacts are open or closed. Because the auxiliary position contacts are mechanically linked to the main contacts, the state of the switch can be determined.

The use of auxiliary contacts is inefficient and expensive. The contacts themselves and their inclusion in the structure of an automatic transfer switch are costly. Moreover these contacts are subject to wear and breakage. In addition, special circuitry must be connected to the contacts to monitor their open/closed state.

SUMMARY OF THE INVENTION

The aforementioned problems of the prior art are overcome by the instant invention which provides a method for determining the state of an automatic transfer switch from voltages measured across the normal and alternate source contacts and normal and alternate source coil control contacts of the switch which are inherent in and necessary to the function of an automatic transfer switch, without need for auxiliary switch position contacts.

The invention teaches a method of determining the state of an automatic transfer switch having output contacts connectable to an electrical load, normal source contacts connected to a normal source of voltage, alternate source contacts connected to an alternate source of voltage, main contacts movable between a normal position at which the main contacts are connected to the normal source contacts and an alternate position at which the main contacts are connected to the alternate source contacts, an electromechanical actuator operatively connected to the main contacts for moving the main contacts between the normal position and the alternate position, normal coil control voltage contacts connected to the actuator and connectable to the normal source of voltage for inducing the actuator means to move the main contacts to the alternate position, and alternate coil control voltage contacts connected to the actuator and connectable to the alternate source of voltage for inducing the actuator to move the main contacts to the normal position. According to the invention, an electrical control circuit determines whether there are voltages across the contacts of the normal source contacts, the alternate source contacts, the normal coil control voltage contacts, and the alternate coil control voltage contacts, respectively, and produces a signal indicating the position of the main contacts as a function of the foregoing determinations.

It is therefore an object of the invention to determine the position of the main contacts of an automatic transfer switch without need for special position contacts on the switch.

Another object of the invention is to determine the position of the main contacts of an automatic transfer switch by monitoring voltages used in connection with the function of the switch.

Still another object of the invention is to determine the position of the main contacts of an automatic transfer switch by monitoring voltages at the normal source voltage contacts, the alternate voltage contacts, the normal source coil control voltage contacts and the alternate source coil control voltage contacts.

A further object of the invention is to detect when an error condition exists in monitoring voltages used in connection with the function of an automatic transfer switch to determine the position of the switch's main contacts.

Other and further objects of the invention will be apparent from the following drawings and description of a preferred embodiment of the invention in which like reference numerals are used to indicate like parts in the various views.

DESCRIPTION OF THE PREFERRED EMBODIMENT

The present invention is applicable to automatic transfer switches, for example, automatic transfer switches of the type described in U.S. Pat. No. 5,748,432 to Przywozny et al. In such an automatic transfer switch, a rotating armature on which the main switch contacts are mounted is reciprocated by a solenoid between a normal position whereat the main contacts are connected to a normal voltage source and an alternate position whereat the main contacts are connected to an alternate or emergency voltage source. Actuation of the solenoid urges a linking arm to initiate rotation of a disc-shaped weight which is connected to the automatic transfer switch's armature. Rotation of the armature from a position at which its main contacts are connected to one of the normal and alternate voltage sources to the other source is completed due to the inertia of the rotating weight.

In accordance with the present invention, the electronic control circuit for the automatic transfer switch determines the switch position from four voltages that exist in a conventional automatic transfer switch. The four voltages are the normal source voltage $V_{S1}$, the alternate or emergency source voltage $V_{S2}$, the coil control voltage $V_{S1CC}$ derived from the normal voltage source and the coil control voltage $V_{S2CC}$ derived from the alternate source.

Figure 1A:
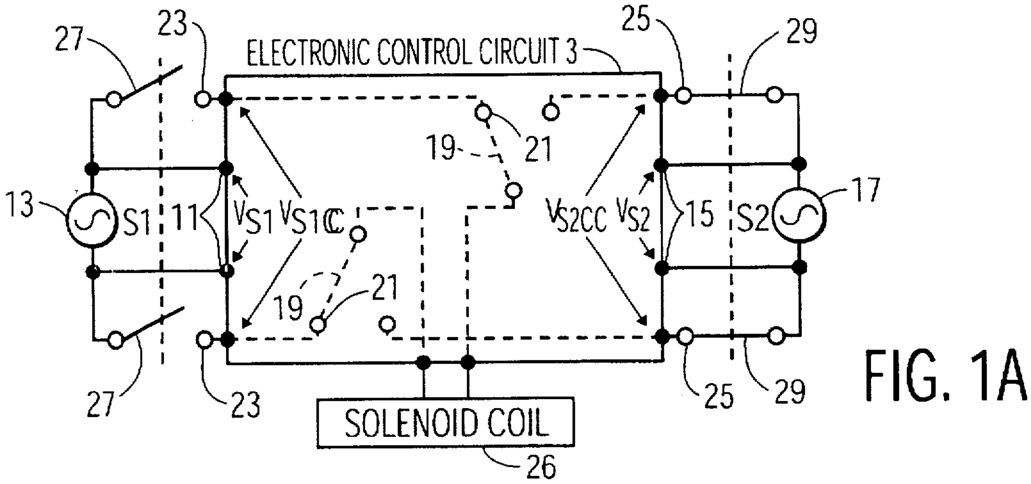
FIG. 1A is a schematic view of a portion of an automatic transfer switch showing the switch's coil control voltage contacts when the automatic transfer switch is in a first disposition prior to transfer of a connected load from a first source of voltage to a second source of voltage.

Referring now to FIG. 1A, there is shown an electronic control circuit 3 having contacts 11 which are connected across a main voltage source 13 and contacts 15 which are connected across an alternate voltage source 17. A power outage-sensing double pole, double throw, relay 19 has its coil connected to the normal voltage source 13, and contacts 21 which are movable between a position at which they are connected to respective normal source coil control voltage contacts 23 as shown in FIG. 1A when the relay coil is powered by the normal voltage source 13, and a position at which the contacts 21 are connected to respective alternate source coil control voltage contacts 25 as shown in FIG. 1C when the relay coil is not powered by the normal voltage source 13.

A normal coil control voltage switch 27 can be closed to connect the normal voltage source 13 to the normal source coil control voltage contacts 23 and opened to disconnect the normal voltage source 13 from the normal source coil control voltage contacts 23. An alternate coil control voltage switch 29 can be closed to connect the alternate voltage source 17 to the alternate source coil control voltage contacts 25 and opened to disconnect the alternate voltage source 17 from the alternate source coil control voltage contacts 25.

Figure 1B:
FIG. 1B is a schematic view of the automatic transfer switch showing the switch's main contacts when the automatic transfer switch is in the same disposition as in FIG. 1A.

As shown in FIGS. 1A and 1B, when the main contacts of the automatic transfer switch connect a load 31 to the normal voltage source 13, the normal source coil control contacts 23 are open and the alternate source coil control contacts 25 are closed.

Figure 1C:
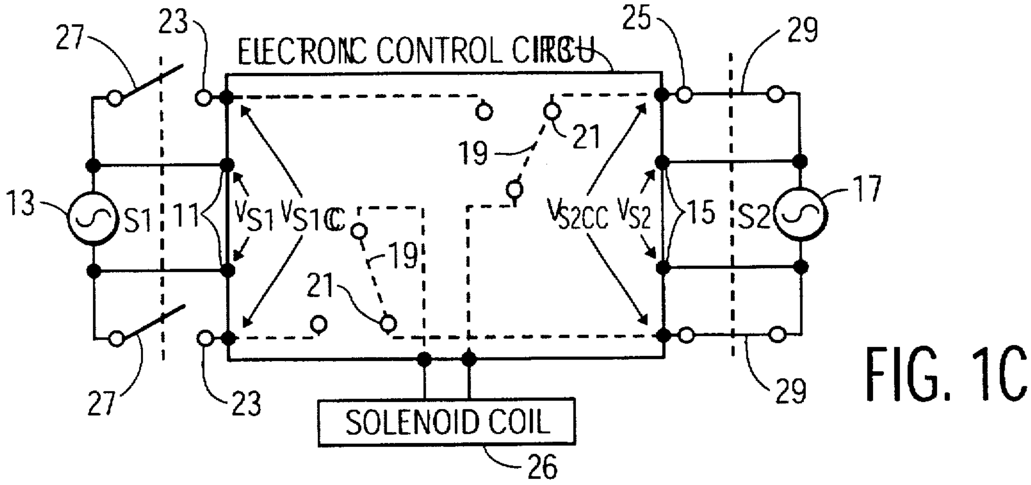
FIG. 1C is a schematic view of the automatic transfer switch showing the switch's coil control voltage contacts when the automatic transfer switch is in a second disposition during transfer of a connected load from the first source of voltage to the second source of voltage.
Figure 1D:
FIG. 1D is a schematic view of the automatic transfer switch showing the switch's main contacts when the automatic transfer switch is in the same disposition as in FIG. 1C.
Figure 1E:
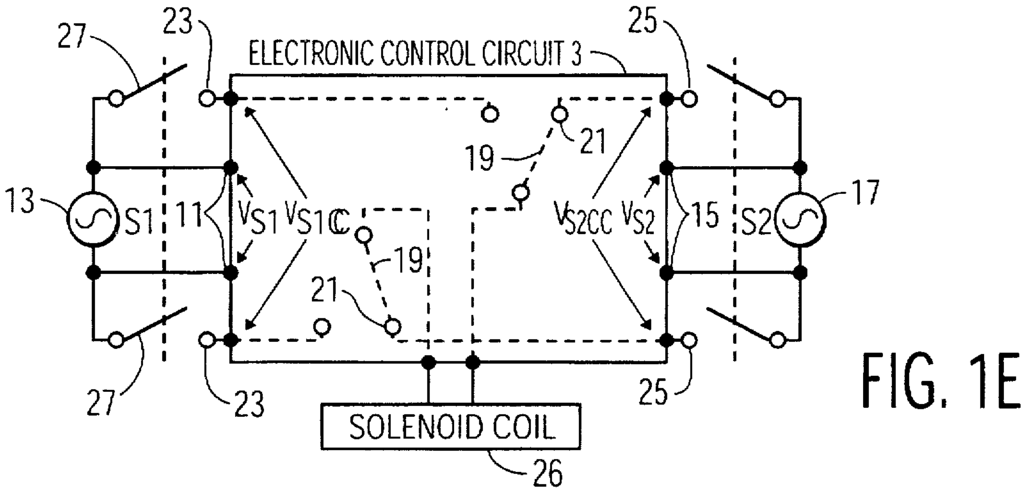
FIG. 1E is a schematic view of the automatic transfer switch showing the switch's coil control voltage contacts when the automatic transfer switch is in a third disposition during transfer of a connected load from the first source of voltage to the second source of voltage.
Figure 1F:
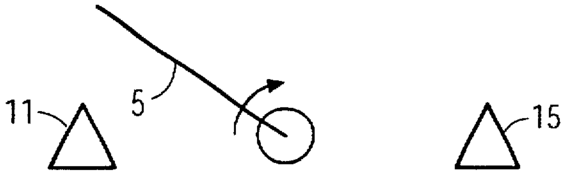
FIG. 1F is a schematic view of the automatic transfer switch showing the switch's main contacts when the automatic transfer switch is in the same disposition as in FIG. 1E.

Upon occurrence of an interruption in current from the normal source 13 the contacts 21 of relay 19 move to close the path between alternate source coil control contacts 25 and the solenoid coil 26 as can be seen in FIGS. 1C and 1D. With the alternate coil control voltage switch 29 closed, the solenoid coil is powered from alternate source 17 and the solenoid begins to rotate the armature of the automatic transfer switch whereby the main switch contacts 5 are opened as seen in FIGS. 1E and 1F. At a point in the rotational movement of the armature whereat the weighted disc mechanism has developed sufficient momentum to propel the switch armature toward a position at which the main contacts 5 will close on alternate source contacts 15, thereby connecting the load 31 to the alternate source 17, the rotating disc causes the alternate coil control voltage switch 29 to open thereby opening the coil control contacts 25 and removing power from the solenoid coil 26.

Figure 1G:
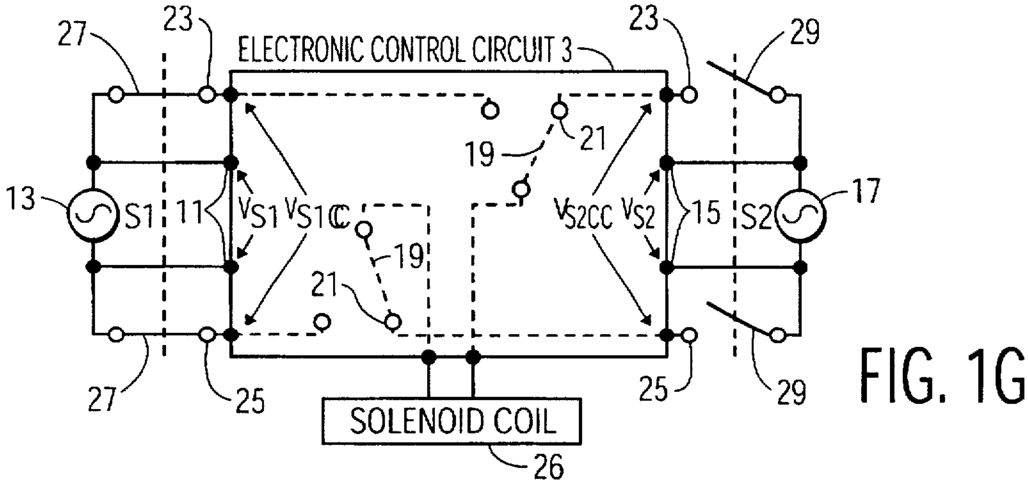
FIG. 1G is a schematic view of the automatic transfer switch showing the switch's coil control voltage contacts when the automatic transfer switch is in a fourth disposition during transfer of a connected load from the first source of voltage to the second source of voltage.
Figure 1H:
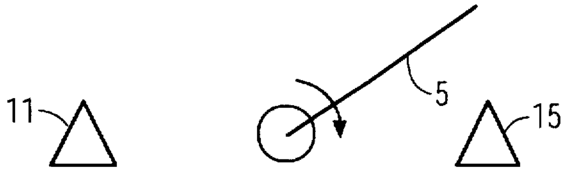
FIG. 1H is a schematic view of the automatic transfer switch showing the switch's main contacts when the automatic transfer switch is in the same disposition as in FIG. 1G.
Figure 1I:
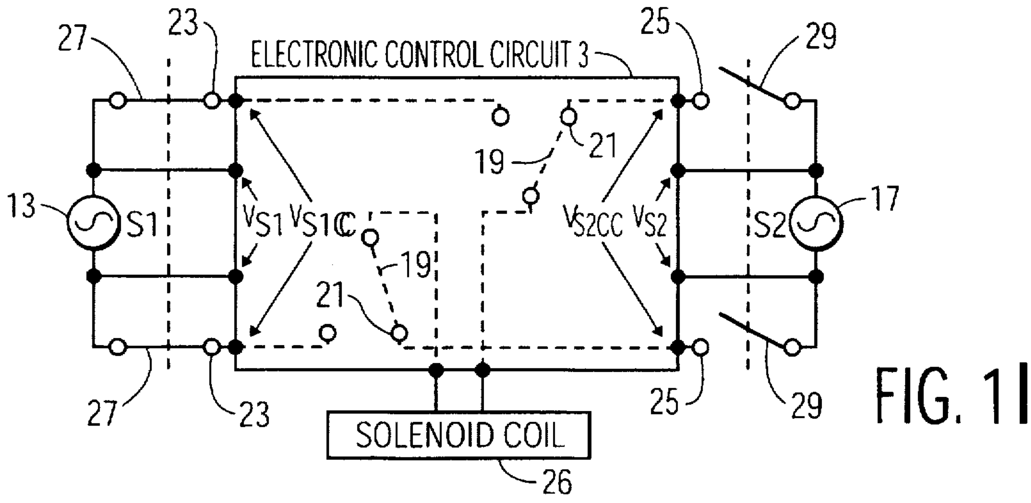
FIG. 1I is a schematic view of the automatic transfer switch showing the switch's coil control voltage contacts when the automatic transfer switch is in a fifth disposition during transfer of a connected load from the first source of voltage to the second source of voltage.
Figure 1J:
FIG. 1J is a schematic view of the automatic transfer switch showing the switch's main contacts when the automatic transfer switch is in the same disposition as in FIG. 1I.

As the momentum of the disc shaped weight causes the transfer switch armature to continue its rotation of the main switch contacts 5 toward closing on the alternate source contacts 15, the rotating disc causes normal source coil control voltage contacts 23 to close (FIGS. 1G and 1H) and thus prepare the switch for the eventual re-transfer of the load 31 from the alternate voltage source 17 to the normal voltage source 13. Finally, the main switch contacts 5 come to rest on the alternate source contacts 15 to power the load as seen in FIGS. 1I and 1J.

When normal power is restored, the transfer switch is again actuated to transfer the load 31 back to the normal voltage source 13 as follows.

Figure 2A:
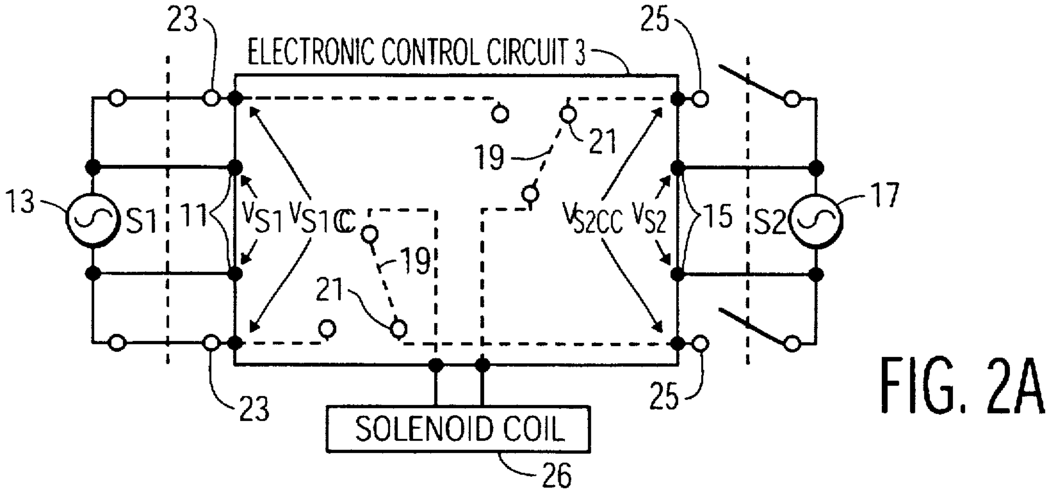
FIG. 2A is a schematic view of the automatic transfer switch showing the switch's coil control voltage contacts when the automatic transfer switch is in a first disposition during transfer of a connected load from the second source of voltage to the first source of voltage.
Figure 2B:
FIG. 2B is a schematic view of the automatic transfer switch showing the switch's main contacts when the automatic transfer switch is in the same disposition as in FIG. 2A.

As shown in FIGS. 2A and 2B, when the main contacts 5 of the automatic transfer switch connect the load 31 to the alternate voltage source contacts 15, the alternate source coil control contacts 25 are open and the normal source coil control contacts 23 are closed.

Figure 2C:
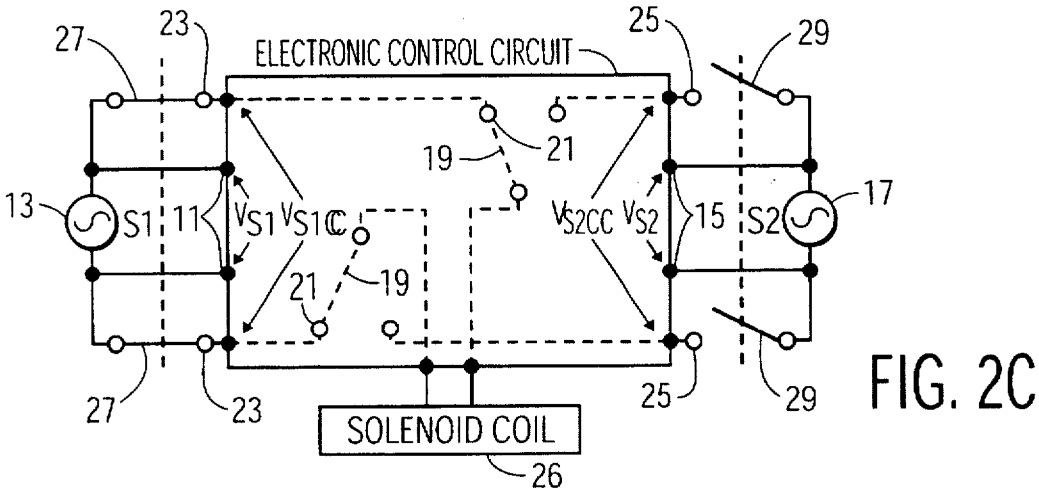
FIG. 2C is a schematic view of the automatic transfer switch showing the switch's coil control voltage contacts when the automatic transfer switch is in a second disposition during transfer of a connected load from the second source of voltage to the first source of voltage.
Figure 2D:
FIG. 2D is a schematic view of the automatic transfer switch showing the switch's main contacts when the automatic transfer switch is in the same disposition as in FIG. 2C.
Figure 2E:
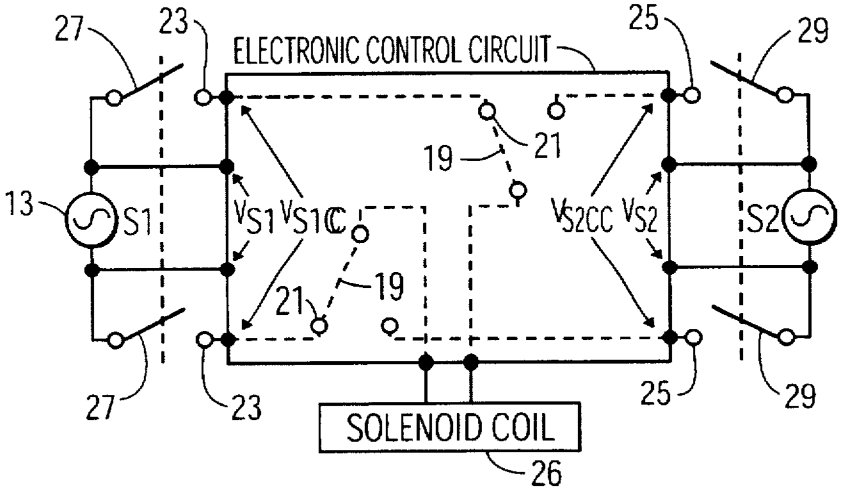
FIG. 2E is a schematic view of the automatic transfer switch showing the switch's coil control voltage contacts when the automatic transfer switch is in a third disposition during transfer of a connected load from the second source of voltage to the first source of voltage.
Figure 2F:
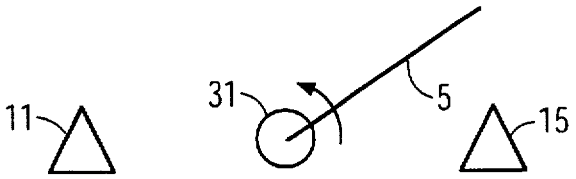
FIG. 2F is a schematic view of the automatic transfer switch showing the switch's main contacts when the automatic transfer switch is in the same disposition as in FIG. 2E.

When restoration of the normal voltage source energizes relay 19, the contacts 21 close the path between normal source coil control contacts 23 and the solenoid coil 26 as can be seen in FIGS. 2C and 2D. With the normal coil control voltage switch 27 closed, the solenoid coil 26 is powered from normal source 13 and the solenoid begins to rotate the armature of the automatic transfer switch whereby the main contacts 5 break their connection with alternate switch contacts 15 as seen in FIGS. 2E and 2F. At a point in the rotational movement of the armature whereat the weighted disc mechanism has developed sufficient momentum to propel the switch armature toward a position at which the contacts 5 will close on normal source contacts 11, thereby reconnecting the load 31 to the normal source 13, the rotating disc causes the normal coil control voltage switch 27 to open thereby opening the coil control contacts 23 and removing power from the solenoid coil 26.

Figure 2G:
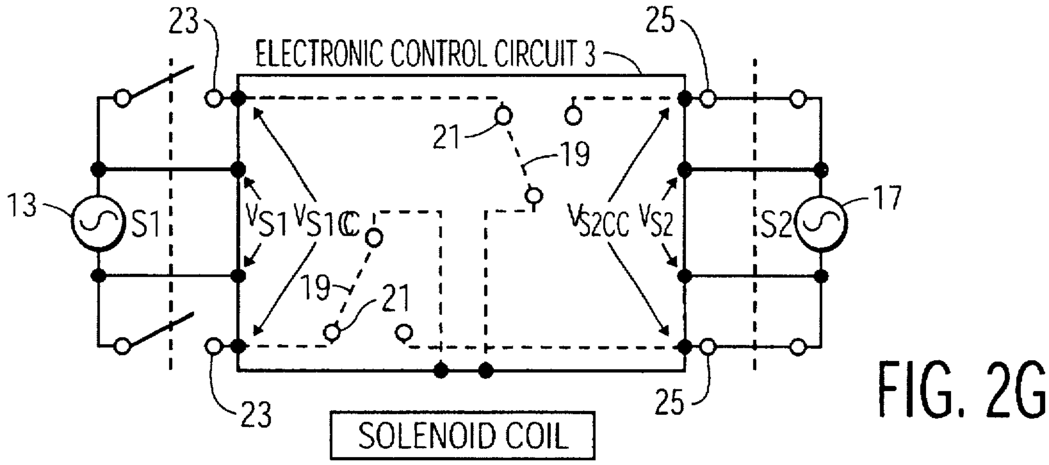
FIG. 2G is a schematic view of an automatic transfer switch showing the switch's coil control voltage contacts when the automatic transfer switch is in a fourth disposition during transfer of a connected load from the second source of voltage to the first source of voltage.
Figure 2H:
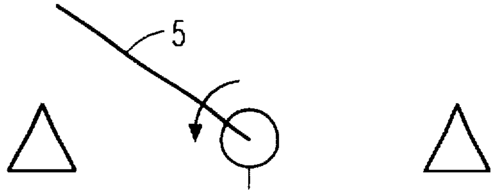
FIG. 2H is a schematic view of the automatic transfer switch showing the switch's main contacts when the automatic transfer switch is in the same disposition as in FIG. 2G.
Figure 2I:
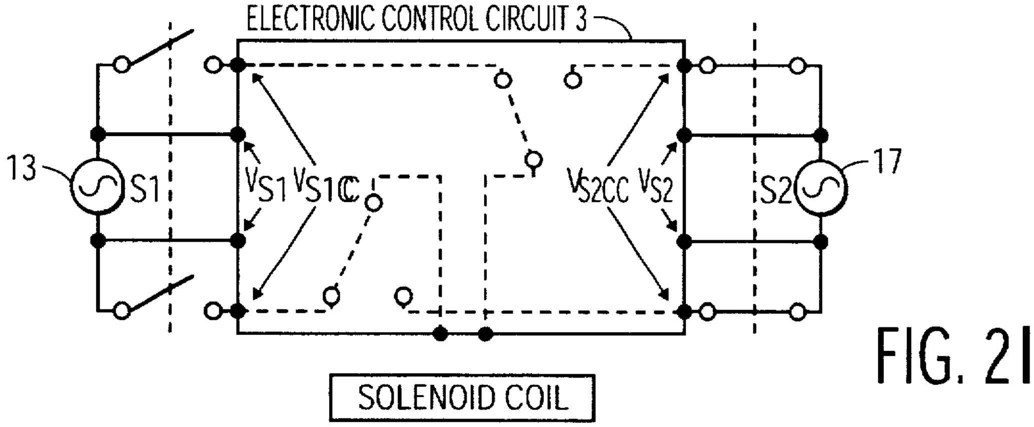
FIG. 2I is a schematic view of the automatic transfer switch showing the switch's coil control voltage contacts when the automatic transfer switch is in a fifth disposition during transfer of a connected load from the second source of voltage to the first source of voltage.
Figure 2J:
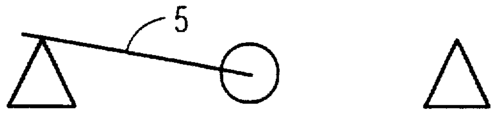
FIG. 2J is a schematic view of the automatic transfer switch showing the switch's main contacts when the automatic transfer switch is in the same disposition as in FIG. 2I.

As the momentum of the disc shaped weight causes the transfer switch armature to continue its rotation of the main switch contacts 5 toward closing on the normal source contacts 11, the rotating disc causes the alternate source coil control voltage contacts 25 to close (FIGS. 2G and 2H) to prepare the switch for transfer of the load from the normal voltage source 13 to the alternate voltage source 17 in the event of another power failure or other event requiring alternate power. Finally, the switch contacts 5 come to rest on the normal source contacts 11 as seen in FIGS. 2I and 1J.

When power is available from at least one of the normal voltage source 13 and the alternate voltage source 17, by monitoring the four voltages, respectively, across the normal source contacts 11, the alternate source contacts 15, the normal source coil control voltage contacts 23, and the alternate source coil control voltage contacts 25, it is possible to determine the instantaneous position of the transfer switch main contacts 5.

Figure 3:
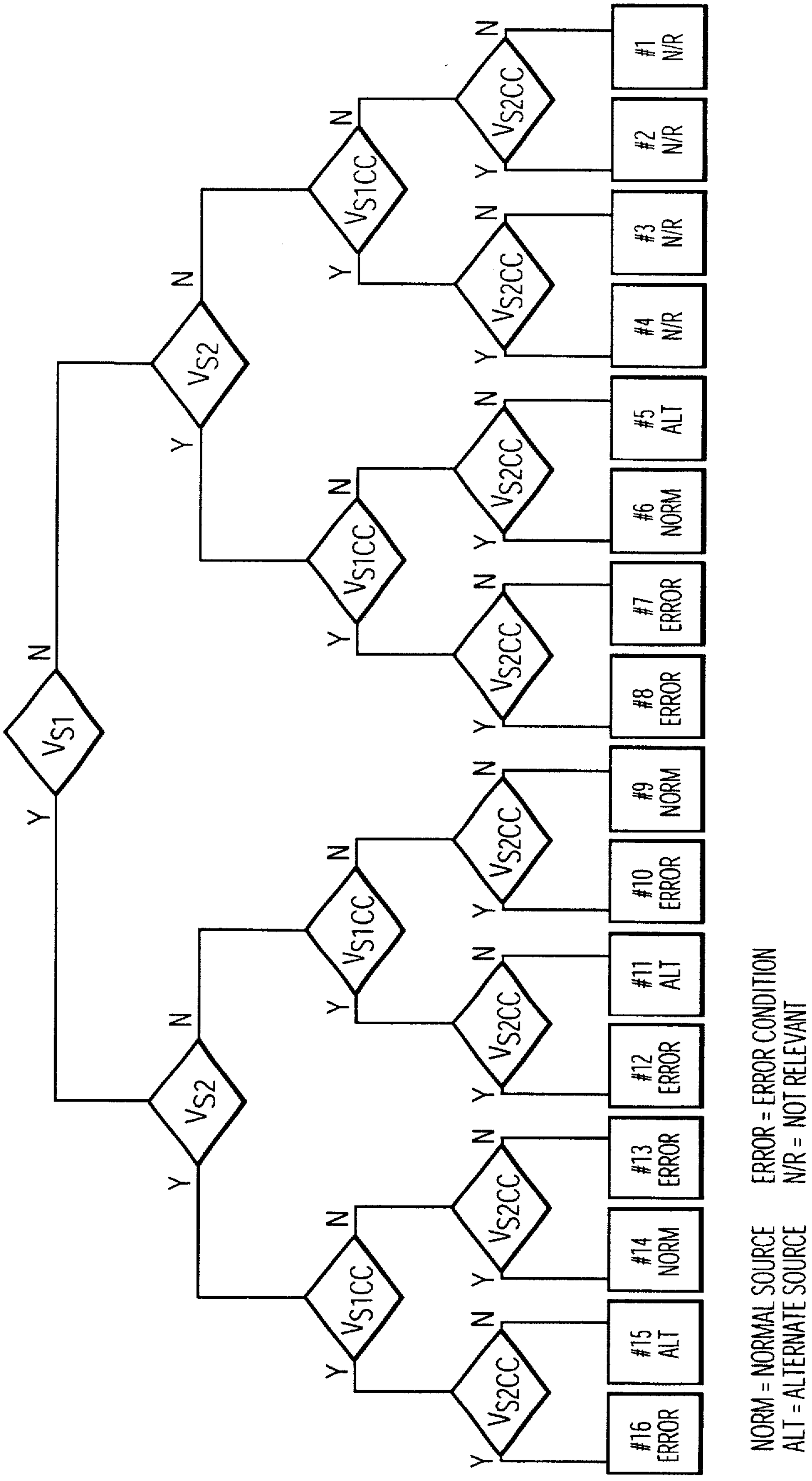
FIG. 3 is a flow diagram of the method in accordance with the preferred embodiment of the invention.

Referring now to FIG. 3, there is shown a flow chart for a method of determining the position of the main contacts 5 without need for special position contacts in an automatic transfer switch. This method can be executed by a computer in the electronic control circuit 3 which is programmed to compare the magnitudes of the voltage $V_{S1}$ across the normal source contacts 11, the voltage $V_{S2}$ across alternate source contacts 15, the voltage $V_{S1CC}$ across normal source coil control voltage contacts 23, and the voltage $V_{S2CC}$ across alternate source coil control voltage contacts 25, respectively, to a zero reference signal, i.e., to see of there is a voltage having a magnitude other than zero present. In FIG. 3, reference Y indicates the presence of a voltage, that is the magnitude of the monitored voltage is greater than zero, and N indicates the absence of a voltage, i.e., the magnitude of the monitored voltage is equal to zero.

In accordance with FIG. 3, if the voltage $V_{S1}$ across the normal source contacts 11, the voltage $V_{S2}$ across alternate source contacts 15, the voltage $V_{S1CC}$ across normal source coil control voltage contacts 23, and the voltage $V_{S2CC}$ across alternate source coil control voltage contacts 25 are of zero magnitude, the position of the main contacts 5 is considered irrelevant since neither the normal nor the alternate source can power the load. The conditions whereby neither source has a nonzero voltage are represented by conditions #1, #2, #3 and #4 in FIG. 3.

If the voltage $V_{S1}$ across the normal source contacts 11 is zero, the voltage $V_{S2}$ across the alternate source contacts 15 is not zero, the voltage $V_{S1CC}$ across the normal source coil control voltage contacts 23 is zero, and the voltage $V_{S2CC}$ across the alternate source coil control voltage contacts 25 is zero, then the transfer switch is in the disposition shown in FIG. 2A with the main contact 5 closed on the alternate source contacts 15 which have a nonzero voltage while the alternate source coil control voltage contacts 25 have no voltage. This condition is represented by condition #5 in FIG. 3.

If the voltage $V_{S1}$ across the normal source contacts 11 is zero, the voltage $V_{S2}$ across the alternate source contacts 15 is not zero, the voltage $V_{S1CC}$ across the normal source coil control voltage contacts 23 is zero, and the voltage $V_{S2CC}$ across the alternate source coil control voltage contacts 25 is not zero, then the transfer switch is in the disposition shown in FIG. 1A with the main contact 5 closed on the normal source contacts while the alternate source contacts 15 have a voltage as do the alternate source coil control voltage contacts 25. This condition is represented by condition #6 in FIG. 3.

If the voltage $V_{S1}$ across the normal source contacts 11 is not zero, the voltage $V_{S2}$ across the alternate source contacts 15 is zero, the voltage $V_{S1CC}$ across the normal source coil control voltage contacts 23 is zero, and the voltage $V_{S2CC}$ across the alternate source coil control voltage contacts 25 is zero, then the transfer switch is in the disposition shown in FIG. 1A with the main contact 5 closed on the normal source contacts 11 which have a voltage while the normal source coil control voltage contacts 23 have no voltage. This condition is represented by condition #9 in FIG. 3.

If the voltage across the normal source contacts 11 is not zero, the voltage $V_{S2}$ across the alternate source contacts 15 is zero, the voltage $V_{S1CC}$ across the normal source coil control voltage contacts 23 is not zero, and the voltage $V_{S2CC}$ across the alternate source coil control voltage contacts 25 is zero, then the transfer switch is in the disposition shown in FIG. 2A with the main contact 5 closed on the alternate source contacts 15 while the normal source contacts 11 have a voltage as do the normal source coil control voltage contacts 23. This condition is represented by condition #11 in FIG. 3.

If the voltage $V_{S1}$ across the normal source contacts 11 is not zero, the voltage $V_{S2}$ across the alternate source contacts 15 is not zero, the voltage $V_{S1CC}$ across the normal source coil control voltage contacts 23 is zero, and the voltage $V_{S2CC}$ across the alternate source coil control voltage contacts 25 is not zero, then the transfer switch is in the disposition shown in FIG. 1A with the main contact 5 closed on the normal source contacts 11 while the alternate source contacts 15 have a voltage as do the alternate source coil control voltage contacts 25. This condition is represented by condition #14 in FIG. 3.

If the voltage $V_{S1}$ across the normal source contacts 11 is not zero, the voltage $V_{S2}$ across the alternate source contacts 15 is not zero, the voltage $V_{S1CC}$ across the normal source coil control voltage contacts 23 is not zero, and the voltage $V_{S2CC}$ across the alternate source coil control voltage contacts 25 is zero, then the transfer switch is in the disposition shown in FIG. 2A with the main contact 5 closed on the alternate source contacts 15 while the normal source contacts 11 have a voltage as do the normal source coil control voltage contacts 23. This condition is represented by condition #15 in FIG. 3.

The following conditions if sensed by the electronic control circuit 3 are error conditions, that is they cannot physically occur.

If the electronic control circuit 3 determined that the voltage $V_{S1}$ across the normal source contacts 11 was zero, the voltage $V_{S2}$ across the alternate source contacts 15 was not zero, the voltage $V_{S1CC}$ across the normal source coil control voltage contacts 23 was not zero, and the voltage $V_{S2CC}$ across the alternate source coil control voltage contacts 25 was zero it would follow that there was voltage across the normal source coil control voltage contacts 23 while the normal source 13 had no voltage. This error condition is indicated by condition #7 in FIG. 3.

If the electronic control circuit 3 determined that the voltage $V_{S1}$ across the normal source contacts 11 was zero, the voltage $V_{S2}$ across the alternate source contacts 15 was not zero, the voltage $V_{S1CC}$ across the normal source coil control voltage contacts 23 was not zero, and the voltage $V_{S2CC}$ across the alternate source coil control voltage contacts 25 was not zero it would follow that there was voltage across the normal source coil control voltage contacts 23 and the alternate source coil control voltage contacts 25, simultaneously. This error condition is indicated by condition #8 in FIG. 3.

If the electronic control circuit 3 determined that the voltage $V_{S1}$ across the normal source contacts 11 was not zero, the voltage $V_{S2}$ across the alternate source contacts 15 was zero, the voltage $V_{S1CC}$ across the normal source coil control voltage contacts 23 was zero, and the voltage $V_{S2CC}$ across the alternate source coil control voltage contacts 25 was not zero it would follow that there was voltage across the alternate source coil control voltage contacts 25 while the alternate source 17 had no voltage. This error condition is indicated by condition #10 in FIG. 3.

If the electronic control circuit 3 determined that the voltage $V_{S1}$ across the normal source contacts 11 was not zero, the voltage $V_{S2}$ across the alternate source contacts 15 was zero, the voltage $V_{S1CC}$ across the normal source coil control voltage contacts 23 was not zero, and the voltage $V_{S2CC}$ across the alternate source coil control voltage contacts 25 was not zero it would follow that there was voltage across the normal source coil control voltage contacts 23 and the alternate source coil control voltage contacts 25, simultaneously. This condition is indicated by condition #12 in FIG. 3.

If the electronic control circuit 3 determined that the voltage $V_{S1}$ across the normal source contacts 11 was not zero, the voltage $V_{S2}$ across the alternate source contacts 15 was not zero, the voltage $V_{S1CC}$ across the normal source coil control voltage contacts 23 was zero, and the voltage $V_{S2CC}$ across the alternate source coil control voltage contacts 25 was zero it would follow that there was no voltage across the normal source coil control voltage contacts 23 and the alternate source coil control voltage contacts 25, simultaneously. There must be voltage across one or the other of the coil control voltage contacts. This error condition is indicated by condition #13 in FIG. 3.

Finally, if the electronic control circuit 3 determined that the voltages $V_{S1}$ across the normal source contacts 11, the alternate source contacts 15, the normal source coil control voltage contacts 23, and the alternate source coil control voltage contacts 25 are all not zero, it would follow that there was voltage across the normal source coil control voltage contacts 23 and the alternate source coil control voltage contacts 25, simultaneously. This error condition is indicated by condition #16 in FIG. 3.

The foregoing conditions are summarized in Table 1.

TABLE 1

| $\lvert V_{S1}\rvert>0$ | $\lvert V_{S2}\rvert>0$ | $\lvert V_{S1CC}\rvert>0$ | $\lvert V_{S2CC}\rvert>0$ | Condition |
|---|---|---|---|---|
| no | no | no | no | 1. Neither source has voltage - irrelevant |
| no | no | no | yes | 2. Neither source has voltage - irrelevant |
| no | no | yes | no | 3. Neither source has voltage - irrelevant |
| no | no | yes | yes | 4. Neither source has voltage - irrelevant |
| no | yes | no | no | 5. Switch contacts 5 are connected to alternate voltage source 17 |
| no | yes | no | yes | 6. Switch contacts 5 are connected to normal voltage source 13 |
| no | yes | yes | no | 7. Error condition |
| no | yes | yes | yes | 8. Error condition |
| yes | no | no | no | 9. Switch contacts 5 are connected to normal voltage source 13 |
| yes | no | no | yes | 10. Error condition |
| yes | no | yes | no | 11. Switch contacts 5 are connected to alternate voltage source 17 |
| yes | no | yes | yes | 12. Error condition |
| yes | yes | no | no | 13. Error condition |
| yes | yes | no | yes | 14. Switch contacts 5 are connected to normal voltage source 13 |
| yes | yes | yes | no | 15. Switch contacts 5 are connected to alternate voltage source 17 |
| yes | yes | yes | yes | 16. Error condition |

Conditions 1 through 4 are ignored because neither source has voltage. Conditions 7 and 10 are error conditions because it is impossible for a coil control contact to have voltage across it if its respective source voltage is not available. Conditions 8, 12 and 16 are error conditions because it is impossible for both sets of coil control contacts to be closed at the same time. Combination 13 is an error condition because if both sources are available voltage must be seen across one of the coil control contacts. The only exception to this is the case when the switch is moving and both sets of coil control contacts are open (see FIGS. 1C and 2C), but these cases are transient and normally of no consequence.

The remaining conditions (5, 6, 9, 11, 14 and 15) are encountered in a properly operating system. If voltage is not seen across either coil control contact (conditions 5 and 9), then the switch position is the same as the source that has voltage. If voltage is seen across normal coil control voltage contacts 23 (conditions 11 and 15), then the switch position is source 2. If voltage is seen across alternate coil control voltage contacts 25 (conditions 6 and 14), then the switch position is source 1.

Figure 4:
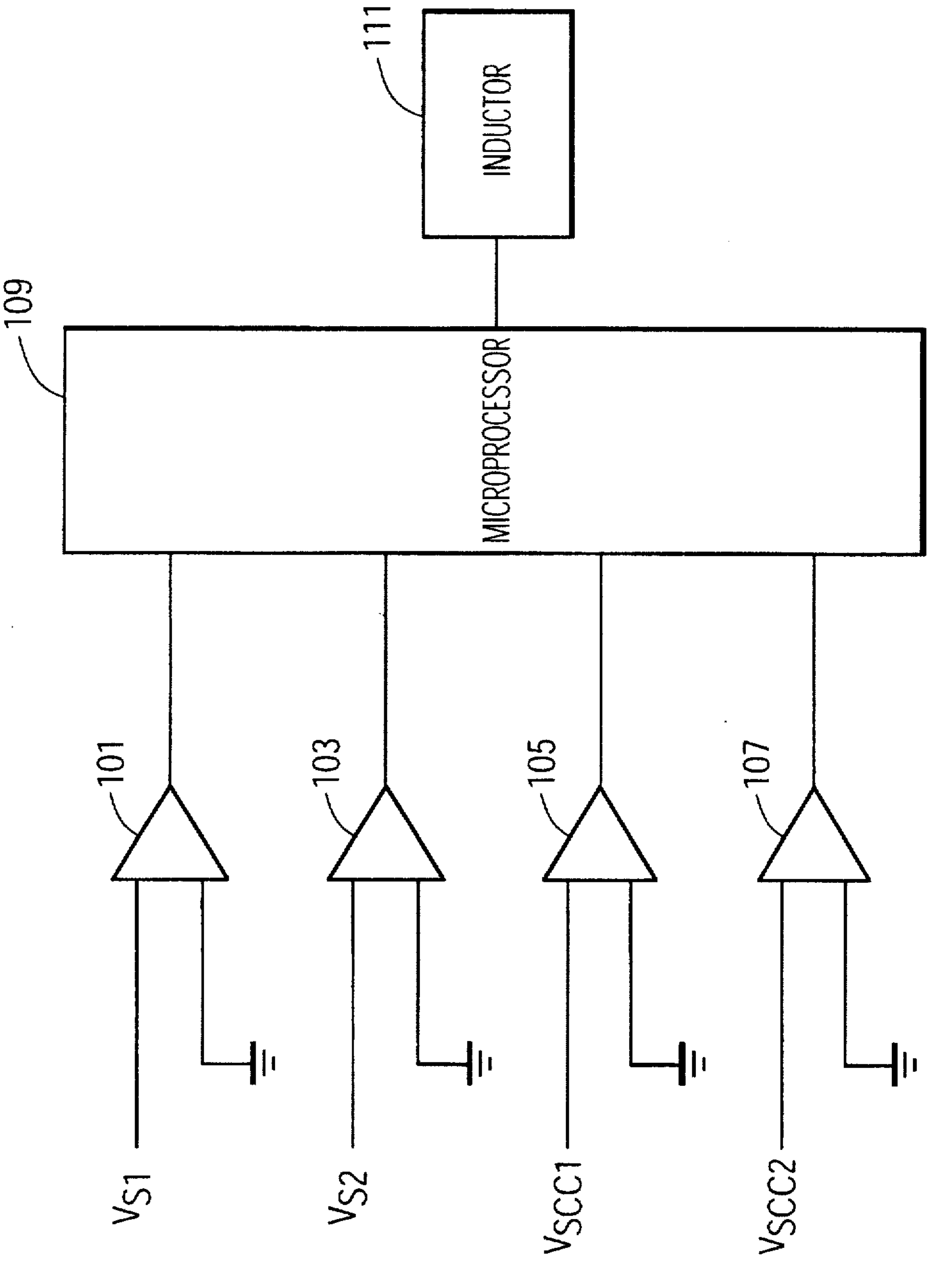
FIG. 4 is a schematic diagram of the apparatus of the preferred embodiment of the invention.

Referring now to FIG. 4, signals having magnitudes proportional to the magnitudes of the normal source voltage $V_{S1}$, measured across contacts 11, the alternate source voltage $V_{S2}$ measured across contacts 15, the normal coil control voltage $V_{S1CC}$, measured across contacts 23, and the alternate coil control voltage $V_{S2CC}$, measured across contacts 25, are applied as input signals to respective comparators 101, 103, 105, and 107. Each of the comparators 101, 103, 105, and 107 compares the magnitude of its respective input signal to a zero level signal. At the output of each comparator 101, 103, 105, 107, there is produced a logic signal indicative of whether or not be corresponding input voltage is equal to 0 volts, i.e. whether or not a voltage is present.

The logic signals at the outputs of the comparators 101, 103, 105, and 107 are sampled at inputs of a microprocessor 109 connected to the comparators 101, 103, 105, and 107. The microprocessor 109 is programmed in accordance with the flow chart illustrated in FIG. 3.

At the output of the microprocessor 109 there are produced signals indicative of the position of the automatic transfer switch's main contacts 5, or an indication of an error condition, as the situation warrants. The signals indicative of automatic transfer switch position or error indication can be applied as inputs to other circuitry in the electronic control circuit for automated decision making based on the disposition of the automatic transfer switch, and/or displayed on an indicator 111 as will be known to those skilled in the art.

It is to be appreciated that the foregoing is a description of a preferred embodiment of the invention to which variations and modifications may be made without departing from the spirit and scope of the invention.

What is claimed is:

1. A method of determining the state of an automatic transfer switch having main contacts connectable to an electrical load, normal source contacts connected to a normal source of voltage, alternate source contacts connected to an alternate source of voltage, said main contacts being movable between a normal position at which said main contacts are connected to said normal source contacts and an alternate position at which said main contacts are connected to said alternate source contacts, electromechanical actuator means operatively connected to said main contacts for moving said main contacts between said normal position and said alternate position, normal coil control voltage contacts connected to said actuator means and connectable across the normal source of voltage for inducing said actuator means to move said main contacts to said alternate position, and alternate coil control voltage contacts connected to said actuator means and connectable across the alternate source of voltage for inducing said actuator means to move said main contacts to said normal position comprising;

determining whether there is a voltage across the normal source contacts, determining whether there is a voltage across the alternate source contacts, determining whether there is a voltage across the normal coil control voltage contacts, determining whether there is a voltage across the alternate coil control voltage contacts, and producing a signal indicating the position of said main contacts as a function of the voltages across the normal source contacts, the alternate source contacts, the normal coil control voltage contacts, and the alternate coil control voltage contacts.

2. A method according to claim 1 wherein said signal indicates that said main contacts are electrically connected to said normal source contacts in response to there being a voltage across said alternate source contacts and said alternate coil control voltage contacts and there being no voltage across said normal coil control voltage contacts.

3. A method according to claim 2 wherein said signal indicates that said main contacts are electrically connected to said normal source contacts in response to there being a voltage across said normal source contacts.

4. A method according to claim 2 wherein said signal indicates that said main contacts are electrically connected to said normal source contacts in response to there being no voltage across said normal source contacts.

5. A method according to claim 1 wherein said signal indicates that said main contacts are electrically connected to said normal source contacts in response to there being a voltage across said normal source contacts and there being no voltage across said alternate source contacts, said normal coil control voltage contacts, and said alternate coil control voltage contacts.

6. A method according to claim 1 wherein said signal indicates that said main contacts are electrically connected to said alternate source contacts in response to there being a voltage across said alternate source contacts and there being no voltage across said normal source contacts, said normal coil control voltage contacts, and said alternate coil control voltage contacts.

7. A method according to claim 1 wherein said signal indicates that said main contacts are electrically connected to said alternate source contacts in response to there being voltages across said normal source contacts and said normal coil control voltage contacts and there being no voltage across said alternate source contacts and said alternate coil control voltage contacts.

8. A method according to claim 1 wherein said signal indicates that said main contacts are electrically connected to said alternate source contacts in response to there being voltages across said normal source contacts, said alternate source contacts, and said normal coil control voltage contacts and there being no voltage across said alternate coil control voltage contacts.

9. A method according to claim 1 wherein said signal indicates the existence of an error condition in response to there being no voltage across said normal source contacts, and there being voltages across said alternate source contacts and said normal coil control voltage contacts.

10. A method according to claim 1 wherein said signal indicates the existence of an error condition in response to there being voltages across said normal source contacts and said alternate coil control voltage contacts, and there being no voltage across said alternate source contacts.

11. A method according to claim 10 wherein said signal indicates the existence of an error condition in response to there being a voltage across said normal coil control voltage contacts.

12. A method according to claim 10 wherein said signal indicates the existence of an error condition in response to there being no voltage across said normal coil control voltage contacts.

13. A method according to claim 1 wherein said signal indicates the existence of an error condition in response to there being voltages across said normal source contacts, said alternate source contacts, said normal coil control voltage contacts, and said alternate coil control voltage contacts.

14. Apparatus for determining the state of an automatic transfer switch having main output contacts connectable to an electrical load, normal source contacts connected to a normal source of voltage, alternate source contacts connected to an alternate source of voltage, said main contacts being movable between a normal position at which said main contacts are connected to said normal source contacts and an alternate position at which said main contacts are connected to said alternate source contacts, electromechanical actuator means operatively connected to said main contacts for moving said main contacts between said normal position and said alternate position, normal coil control voltage contacts connected to said actuator means and connectable across the normal source of voltage for inducing said actuator means to move said main contacts to said alternate position, and alternate coil control voltage contacts connected to said actuator means and connectable across the alternate source of voltage for inducing said actuator means to move said main contacts to said normal position, said apparatus comprising;

normal source voltage monitoring means for determining whether there is a voltage across the source contacts, alternate source voltage monitoring means for determining whether there is a voltage across the alternate source contacts, normal coil control voltage monitoring means for determining whether there is a voltage across the normal coil control voltage contacts, alternate coil control voltage monitoring means for determining whether there is a voltage across the alternate coil control voltage contacts, and processor means responsive to said normal source voltage monitoring means, alternate source voltage monitoring means, normal coil control voltage monitoring means, and alternate coil control voltage monitoring means, for producing a signal indicating the position of said main contacts as a function of the voltages across the normal source contacts, the alternate source contacts, the normal coil control voltage contacts, and the alternate coil control voltage contacts.

15. Apparatus for determining the state of an automatic transfer switch according to claim 14 wherein said processor means is operatively connected to said normal source voltage monitoring means, alternate source voltage monitoring means, normal coil control voltage monitoring means and alternate coil control voltage monitoring means, and said signal indicates that said main contacts are electrically connected to said normal source contacts in response to there being a voltage across said alternate source contacts and said alternate coil control voltage contacts and there being no voltage across said normal coil control voltage contacts.

16. Apparatus according to claim 15 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said normal source contacts in response to there being a voltage across said normal source contacts.

17. Apparatus according to claim 15 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said normal source contacts in response to there being no voltage across said normal source contacts.

18. Apparatus according to claim 14 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said normal source contacts in response to there being a voltage across said normal source contacts and there being no voltage across said alternate source contacts, said normal coil control voltage contacts, and said alternate coil control voltage contacts.

19. Apparatus according to claim 14 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said alternate source contacts in response to there being a voltage across said alternate source contacts and there being no voltage across said normal source contacts, said normal coil control voltage contacts, and said alternate coil control voltage contacts.

20. Apparatus according to claim 1 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said alternate source contacts in response to there being voltages across said normal source contacts and said normal coil control voltage contacts and there being no voltage across said alternate source contacts and said alternate coil control voltage contacts.

21. Apparatus according to claim 14 wherein said processor means is operatively connected to said normal source voltage monitoring means, alternate source voltage monitoring means, normal coil control voltage monitoring means and alternate coil control voltage monitoring means and said signal indicates that said main contacts are electrically connected to said alternate source contacts in response to there being voltages across said normal source contacts, said alternate source contacts, and said normal coil control voltage contacts and there being no voltage across said alternate coil control voltage contacts.

22. Apparatus according to claim 14 wherein said processor means is operatively connected to said normal source voltage monitoring means, alternate source voltage monitoring means, normal coil control voltage monitoring means and alternate coil control voltage monitoring means and said signal indicates the existence of an error condition in response to there being no voltage across said normal source contacts, and there being voltages across said alternate source contacts and said normal coil control voltage contacts.

23. Apparatus according to claim 14 wherein said processor means is operatively connected to said normal source voltage monitoring means, alternate source voltage monitoring means, normal coil control voltage monitoring means and alternate coil control voltage monitoring means and said signal indicates the existence of an error condition in response to there being voltages across said normal source contacts and said alternate coil control voltage contacts, and there being no voltage across said alternate source contacts.

24. Apparatus according to claim 23 wherein said processor means is operatively connected to said normal source voltage monitoring means, alternate source voltage monitoring means, normal coil control voltage monitoring means and alternate coil control voltage monitoring means and said signal indicates the existence of an error condition in response to there being a voltage across said normal coil control voltage contacts.

25. Apparatus according to claim 23 wherein said processor means is operatively connected to said normal source voltage monitoring means, alternate source voltage monitoring means, normal coil control voltage monitoring means and alternate coil control voltage monitoring means and said signal indicates the existence of an error condition in response to there being no voltage across said normal coil control voltage contacts.

26. Apparatus according to claim 14 wherein said processor means is operatively connected to said normal source voltage monitoring means, alternate source voltage monitoring means, normal coil control voltage monitoring means and alternate coil control voltage monitoring means and said signal indicates the existence of an error condition in response to there being voltages across said normal source contacts, said alternate source contacts, said normal coil control voltage contacts, and said alternate coil control voltage contacts.

* * * * *